United States Patent
Chen et al.

(10) Patent No.: US 10,175,571 B2
(45) Date of Patent: Jan. 8, 2019

(54) HYBRID COLORING METHODOLOGY FOR MULTI-PATTERN TECHNOLOGY

(71) Applicant: QUALCOMM Incorporated, San Diego, CA (US)

(72) Inventors: Xiangdong Chen, San Diego, CA (US); Hyeokjin Bruce Lim, San Diego, CA (US); Ohsang Kwon, San Diego, CA (US); Mickael Malabry, San Diego, CA (US); Jingwei Zhang, San Diego, CA (US); Raymond George Stephany, Austin, TX (US); Haining Yang, San Diego, CA (US); Kern Rim, San Diego, CA (US); Stanley Seungchul Song, San Diego, CA (US); Mukul Gupta, San Diego, CA (US); Foua Vang, Lemon Grove, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/182,510

(22) Filed: Jun. 14, 2016

(65) Prior Publication Data

US 2016/0370699 A1 Dec. 22, 2016

Related U.S. Application Data

(60) Provisional application No. 62/182,168, filed on Jun. 19, 2015.

(51) Int. Cl.
*G06F 17/50* (2006.01)
*G03F 1/70* (2012.01)
*G03F 7/20* (2006.01)

(52) U.S. Cl.
CPC ............ *G03F 1/70* (2013.01); *G03F 7/70433* (2013.01); *G03F 7/70466* (2013.01); *G06F 17/5068* (2013.01)

(58) Field of Classification Search
CPC . H01L 2924/13091; H01L 2924/00014; H01L 27/0207; G06F 21/79; G06F 21/86;
(Continued)

(56) References Cited

U.S. PATENT DOCUMENTS 8,484,607 B1 7/2013 Tang et al.
8,629,064 B2 1/2014 Li et al.
(Continued)

OTHER PUBLICATIONS

International Search Report and Written Opinion—PCT/US2016/037684—ISA/EPO—dated Nov. 22, 2016.

*Primary Examiner* — Binh Tat
(74) *Attorney, Agent, or Firm* — Arent Fox LLP

(57) ABSTRACT

In an aspect of the disclosure, a method, a computer-readable medium, and an apparatus for assigning feature colors for a multiple patterning process are provided. The apparatus receives integrated circuit layout information including a set of features and an assigned color of a plurality of colors for each feature of a first subset of features of the set of features. In addition, the apparatus performs color decomposition on a second subset of features to assign colors to features in the second subset of features. The second subset of features includes features in the set of features that are not included in the first subset of features with an assigned color.

25 Claims, 6 Drawing Sheets

(58) Field of Classification Search
CPC ......... G06F 2221/2129; G06F 17/5081; G06F 2217/12; G06F 12/0866; G06F 1/1626; G06F 2212/2022; G06F 17/30244; G06F 17/5068; G06F 2217/06; G06F 17/5077; G06F 17/30241; G06F 17/30256; G06F 17/30265; G06F 17/30867; G06F 17/3087; G06F 17/30879; G06K 9/00664; G06K 9/00577; G06K 9/4604; H04N 1/32101; H04N 1/2133; H04N 5/23222
USPC .................................................. 716/50–56
See application file for complete search history.

(56) References Cited

U.S. PATENT DOCUMENTS

| | | |
|---|---|---|
| 8,689,151 B1 | 4/2014 | Agarwal et al. |
| 8,782,570 B1 | 7/2014 | Li et al. |
| 9,026,953 B2 | 5/2015 | Chen et al. |
| 2012/0196230 A1* | 8/2012 | Cho .................. G03F 7/70433 430/319 |
| 2013/0074018 A1* | 3/2013 | Hsu .......................... G03F 1/70 716/55 |
| 2014/0201692 A1 | 7/2014 | Chen et al. |
| 2014/0245237 A1* | 8/2014 | Cilingir .............. G03F 7/70433 716/51 |
| 2015/0089457 A1 | 3/2015 | Agarwal et al. |
| 2015/0095865 A1 | 4/2015 | Bhattacharya et al. |
| 2015/0121317 A1* | 4/2015 | Lee .......................... G03F 1/00 716/52 |
| 2015/0286771 A1* | 10/2015 | Choi ....................... G03F 7/70 716/51 |

\* cited by examiner

HYBRID COLORING METHODOLOGY FOR MULTI-PATTERN TECHNOLOGY

CROSS-REFERENCE TO RELATED APPLICATION(S)

This application claims the benefit of U.S. Provisional Application Ser. No. 62/182,168, entitled "HYBRID COLORING METHODOLOGY FOR MULTI-PATTERN TECHNOLOGY" and filed on Jun. 19, 2015, which is expressly incorporated by reference herein in its entirety.

BACKGROUND

Field

The present disclosure relates generally to multi-pattern technology, and more particularly, to a hybrid coloring methodology for multi-pattern technology.

Background

Continued demand for better performance and power consumption of integrated circuits (ICs) has led to vast technological improvements in the semiconductor industry. The reduction of the size of components within the ICs, which allows for greater transistor density, faster speeds, and lower power consumption, is one such improvement.

Lithographic resolution, which governs the ability to project an accurate image of very small objects onto an IC substrate, is limited in part by the wavelength of light used during photolithography. This limit in lithographic resolution may be referred to as a "printable threshold." Multi-patterning lithography (MPL) is one lithography technique that may be used to increase IC pattern density and overcome the limitations in lithographic resolution. MPL allows an IC layout to be decomposed into two or more colors (e.g., red, blue, yellow, etc.), such that features of one color are formed on one mask and features of another color are formed on another mask. By dividing features of an IC layout into multiple masks, it is possible to fabricate semiconductor devices with object sizes and spacing that are beyond the limits of lithographic resolution.

MPL, however, has many drawbacks, including very long color decomposition run times, color balance issues at chip level, and color conflict. Thus, the need arises for a solution that improves the color decomposition speed of MPL while avoiding color balance and conflict issues.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus for assigning feature colors for a multiple patterning process are provided. The apparatus may be tool (e.g., software tool) for performing color decomposition. The apparatus is configured to receive integrated circuit layout information. The integrated circuit layout information includes a set of features and an assigned color of a plurality of colors for each feature of a first subset of features of the set of features. In addition, the apparatus is configured to perform color decomposition on a second subset of features to assign colors to features in the second subset of features. The second subset of features includes features in the set of features that are not included in the first subset of features with the assigned color.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
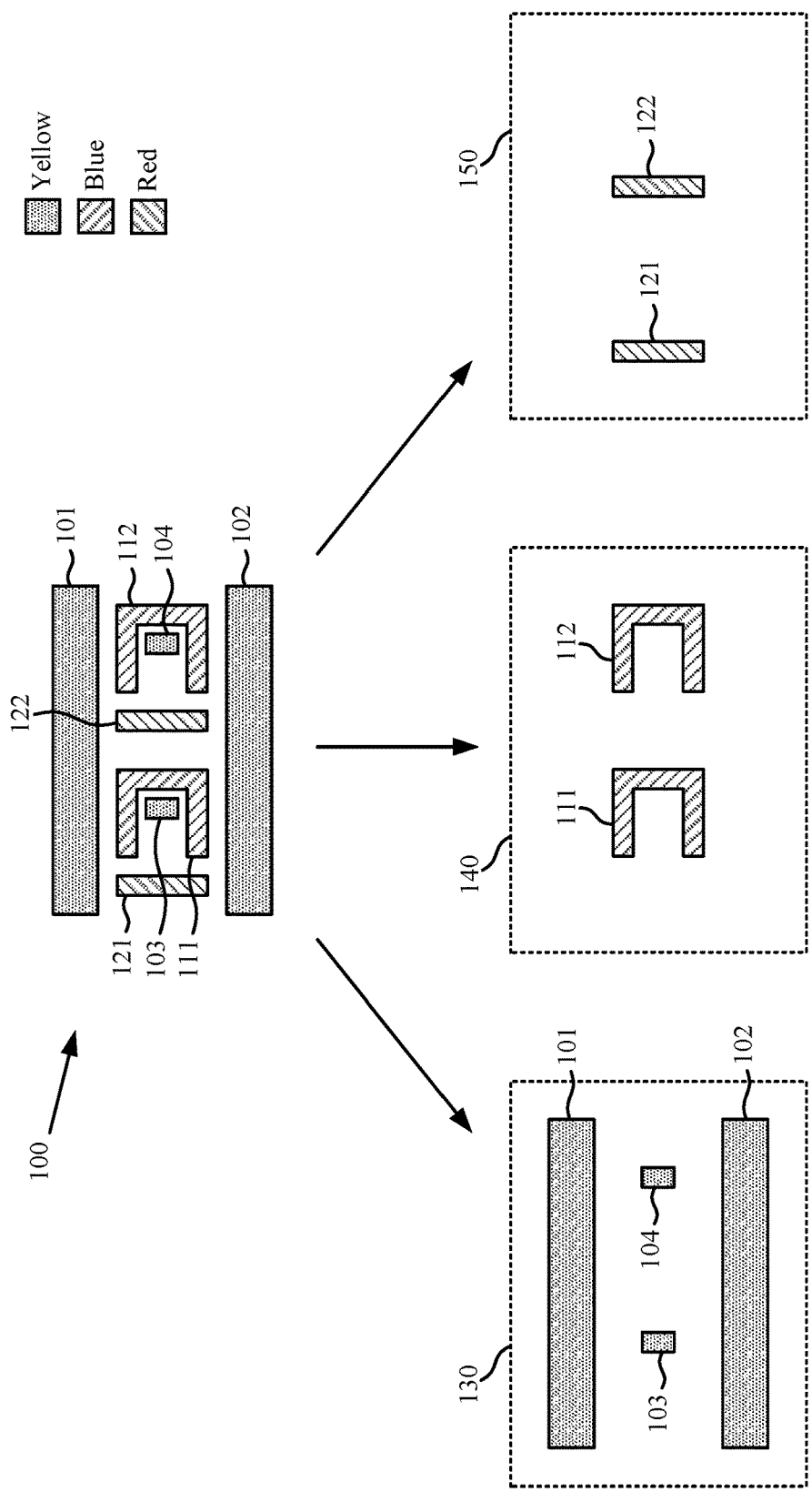
FIG. 1 is a diagram conceptually illustrating an exemplary decomposition of an IC layout for a multi-patterning lithography process.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc. Moreover, the term "component" as used herein may be one of the parts that make up a system, may be hardware or software or some combination thereof, and may be divided into other components.

To fabricate an integrated circuit (IC), a designer may use an electronic design automation (EDA) tool to create a schematic design. This schematic design may include circuits that are coupled together to perform one or more functions. The schematic design may be translated into a representation of an actual physical arrangement of materials, which upon completion is called a design layout. Materials may be arranged in multiple layers for an IC, resulting in a design layout that includes several design layers.

After the design layers are complete, a fabrication process may be used to actually form the appropriate materials on each layer. This process may include a photolithographic process that directs a light source at a mask. In general, the mask may have opaque and transparent regions that when illuminated causes light to fall on photosensitive material in a desired pattern. For example, after light is shined through the mask onto a photosensitive material (e.g., positive resist), the light-sensitive material is subjected to a developing process to remove those portions exposed to light (or, alternatively, remove those portions not exposed to light when using a negative resist). Etching, deposition, diffusion, or some other material altering process may then be performed on the patterned layer until a particular material is formed with the desired pattern in that layer. The result of the process is a predetermined arrangement of material in each layer.

According to one aspect, a designer may use a library of standard cells to form the circuits, which in turn can be coupled to provide the desired functionality. Each standard cell may be a defined group of features constituting at least a portion of various structures, such as transistors and interconnects that provides a Boolean logic function (e.g., AND, OR, XOR, inversion, etc.) or a storage function (e.g., a flip-flop or a latch). In one aspect, the features may represent at least one of a metal interconnect, a power rail, a POLY gate interconnect, a via, a metal POLY (MP) interconnect (which may be referred to as a metal diffusion contact B (CB) interconnect), or a metal diffusion (MD) interconnect (which may be referred to as a metal diffusion contact A (CA) interconnect). The features may also represent at least one of a metal cut, a POLY cut, and a metal POLY cut, each of which may be achieved by line and cut patterning. Line and cut patterning is a lithographic process that involves patterning feature lines (e.g., metal, POLY, or POLY metal) and then printing cut patterns in an orthogonal direction to the lines in order to create a short space (e.g., a "cut") separating at least one of the lines into two line parts. Each standard cell may also have a layout view, which provides an effective manufacturing blueprint for a material layer.

MPL may allow the use of multiple masks to expose the same IC substrate, thereby effectively multiplying the feature/object density in that layer. For example, FIG. 1 is a diagram conceptually illustrating an exemplary color decomposition of an IC layout 100 for an MPL process. The IC layout 100 may include a plurality of features (also referred to as objects) 101, 102, 103, 104, 111, 112, 121, 122, each of which may be separated from a neighboring feature by a space that is less than the printable threshold (i.e., which cannot be formed on a single mask).

Color decomposition involves "coloring" or "color assignment" of features where each color corresponds to a different mask. The color assignment should be done such that features in each mask of a particular color do not violate the minimum printable threshold spacing.

Because neighboring features are separated by a space that is less than the printable threshold, neighboring features may be decomposed to different masks. For example, features 101, 102, 103, 104, 111, 112, 121, 122 may be decomposed in a manner that forms a first mask 130, a second mask 140, and a third mask 150. Specifically, as shown in FIG. 1, features 101, 102, 103, 104 may be assigned a first color (e.g., yellow) associated with the first mask 130, features 111, 112 may be assigned a second color (e.g., blue) associated with the second mask 140, and features 121, 122 may be assigned a third color (e.g., red) associated with the third mask 150.

The first mask 130, second mask 140, and third mask 150, when exposed separately and subsequently combined, may achieve the target pattern of the IC layout 100.

The MPL process may be extended to multiple patterning of N masks where N is an integer. The printable feature spacing may be reduced approximately by a factor of N because feature spacing belonging to different masks is no longer limited by the wavelength of light. Increasing the number of masks, however, exponentially increases the complexity of color decomposition, resulting in very long color decomposition run times, and introducing other issues, such as color balance and color conflict.

Accordingly, aspects of the present disclosure relate to a method and apparatus for hybrid coloring of standard cells during the MPL process to reduce the complexity of color decomposition that results from decomposing multiple colors.

Figure 2:
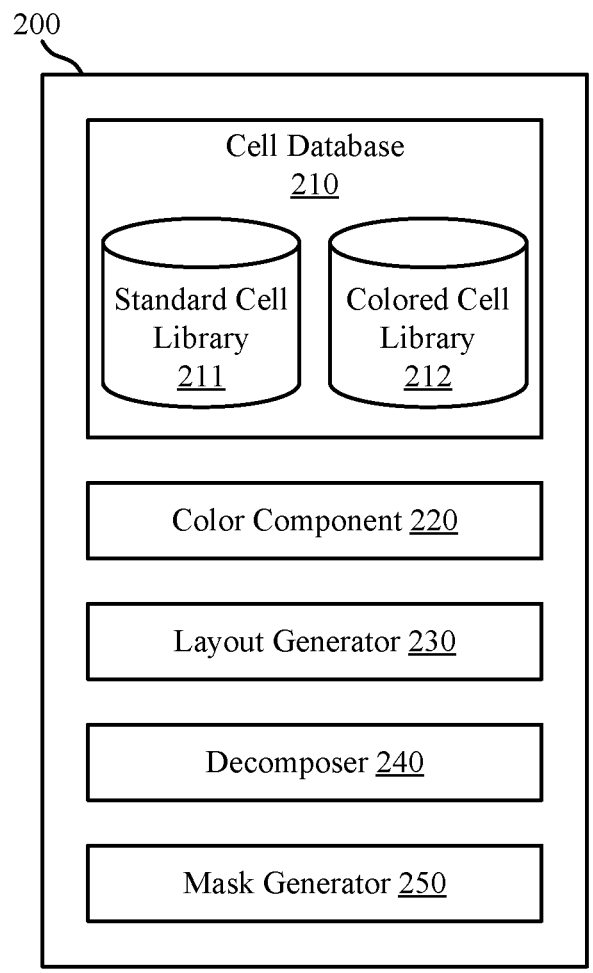
FIG. 2 is a diagram conceptually illustrating an example apparatus configured for hybrid coloring during a multi-patterning lithography process.

FIG. 2 is a diagram conceptually illustrating an example apparatus 200 configured for hybrid coloring during an MPL process. In an aspect, the apparatus 200 may include a cell database 210, which may include a standard cell library 211 and a colored cell library 212. The standard cell library 211 may include a plurality of colorless standard cells, each of which defines a structure of features that provides a function, as previously discussed. The standard cells may be colorless in that none of the features of the standard cell are assigned a color. The colored cell library 212 may include a plurality of colored standard cells. Each of the colored standard cells in the colored cell library 212 may include at least one feature that has been assigned a color by the color component 220. Furthermore, each of the colored standard cells may correspond to a respective colorless standard cell in the standard cell library 211.

The color component 220 may assign a color to at least one of the features of the colorless standard cells of the standard cell library 211, and store the standard cell with the assigned color(s) in the colored cell library 212 as a colored standard cell. The color component 220 may assign colors automatically, based on a preconfigured color setting that complies with a minimum spacing requirement for features within a cell, or via a user input. The color component 220 may also be configured to determine the legality of the color assignment of a feature in a cell. For example, according to one aspect, the color component 220 may determine that two features that are assigned the same color within a standard cell violate the minimum spacing requirement when the spacing between the two features in the cell is less than a minimum spacing threshold (e.g., 70 nm). The color component 220 may then alert the user of the illegal color assignment, suggest an alternative color assignment, or automatically correct the color assignment by reassigning the color to a different feature.

The color component 220 may also determine the legality of the color assignment by analyzing potential layout placement of the colored standard cells. For example, the color component 220 may determine that the placement of two of the same or different colored standard cells side by side may violate the minimum spacing requirement when the spacing between a colored feature of one cell and a similarly colored feature of another cell is less than the minimum spacing threshold. In this case, the color component 220 may, again, either alert the user of the illegal color assignment, suggest an alternative color assignment of a feature in one or both of the cells, or automatically correct the color assignment by reassigning the color to one or more different features. If the color component 220 assigns more than one color to a standard cell or cells, and detects an illegal color assignment, the color component 220 may correct the color assignment by swapping the colors of the features within the colored cell or cells, either automatically or via user input.

The apparatus 200 may include a layout generator 230. The layout generator 230 may receive IC layout information for a particular IC design layout, which may include a physical layout of standard cells. The IC layout information may be provided by a user and/or accessed from memory. The layout generator 230 may then access the cell database 210 and determine whether any of the cells in the physical layout correspond to the cells that are stored in the colored cell library 212. If so, then the layout generator 230 may use the colored standard cells from the colored cell library 212 for the corresponding cells in the physical layout. For any other cells in the physical layout that the layout generator 230 does not find corresponding colored standard cells, the layout generator 230 may use the colorless standard cells from the standard cell library 211. Once the layout generator 230 acquires the necessary cells from the cell database 210, the layout generator 230 may generate a graphical IC layout based on the IC layout information and the acquired cells. The graphical IC layout may be a file that contains a graphical representation of an integrated chip. In some aspects, the graphical IC layout may include a Graphic Database System (GDS) file, such as a GDS or a GDSII file. In other aspects, the graphical IC layout may include a Caltech Intermediate Form (CIF) or an Open Artwork System Interchange Standard (OASIS) file format, for example.

The apparatus 200 may also include a decomposer 240. The decomposer 240 may receive the graphical IC layout from the layout generator 230, and execute a decomposition algorithm on the graphical IC layout. The decomposition algorithm may assign different colors to uncolored features of the graphical IC layout (i.e., features that have not been assigned a color by the color component 220), while maintaining the pre-assigned colors of the colored features (i.e., features that were assigned a color by the color component 220), until all features in the graphical IC layout are assigned a color. In an aspect, the decomposer 240 may assign two or more colors to the uncolored features. In another aspect, the decomposer 240 may assign colors that are different from the colors assigned by the color component 220. In yet another aspect, the decomposer 240 may assign one or more colors that are the same as one or more of the colors assigned by the color component 220. The different colored and colorless features may be associated with different masks used in the MPL process, as exemplified in FIG. 1.

In an aspect, the MPL process implemented by the apparatus 200 may be an n-patterning process with n colors (e.g., n=3). The graphical IC layout may include a set of p features (e.g., p=8). The features that were assigned a color by the color component 220 may constitute a first subset of q features (e.g., q=4), and the features that were assigned a color by the decomposer may constitute a second subset of p–q features (e.g., p–q=4). In one aspect, the decomposer 240 may perform color decomposition on the second subset of p–q features with a subset of colors that includes fewer than n colors (e.g., 2 colors<n). More specifically, if the first subset of features includes m different colors (e.g., m=1), then the color decomposition is performed on the second subset of p–q features with x colors (e.g., x=2), where n–m≤x≤n (e.g., 3–1≤2≤3). In another aspect, the decomposer 240 may perform color decomposition on the second subset of p–q features with n colors.

In this manner, by offloading some of the color assignments from the decomposer 240 onto the color component 220, the apparatus 200 may significantly reduce the processing load on the decomposer 240, thereby shortening color decomposition run times, as well as potentially avoiding other issues such as color balance and color conflict.

In an aspect, the apparatus 200 may also include a mask generator 250. The mask generator 250 may generate multiple masks, based on the colored graphical IC layout received from the decomposer 240, in a manner that writes features having the same color to the same mask. In one aspect, the mask generator 250 may write only the features that were pre-colored by the color component 220 to one mask, while writing the features that were colored by the decomposer 240 to other masks based upon the colors assigned to the other masks or the lack of colors assigned to the other masks. For example, in an MPL process, the mask generator 250 may generate a first mask for features that have been assigned a first color by the decomposer 240, a second mask for features that have been assigned a second color by the decomposer 240, and a third mask for features that have been assigned a third color by the decomposer 240 as well as features that have been assigned a color by the color component 220. In other words, when forming masks, the mask generator 250 may write pre-colored features to a mask independent of the decomposition algorithm, while non-pre-colored features are written to a mask based upon a color assigned to the features by the decomposer 240. Once the masks are generated by the mask generator 250, the masks may be used in a semiconductor fabrication process.

Figure 3:
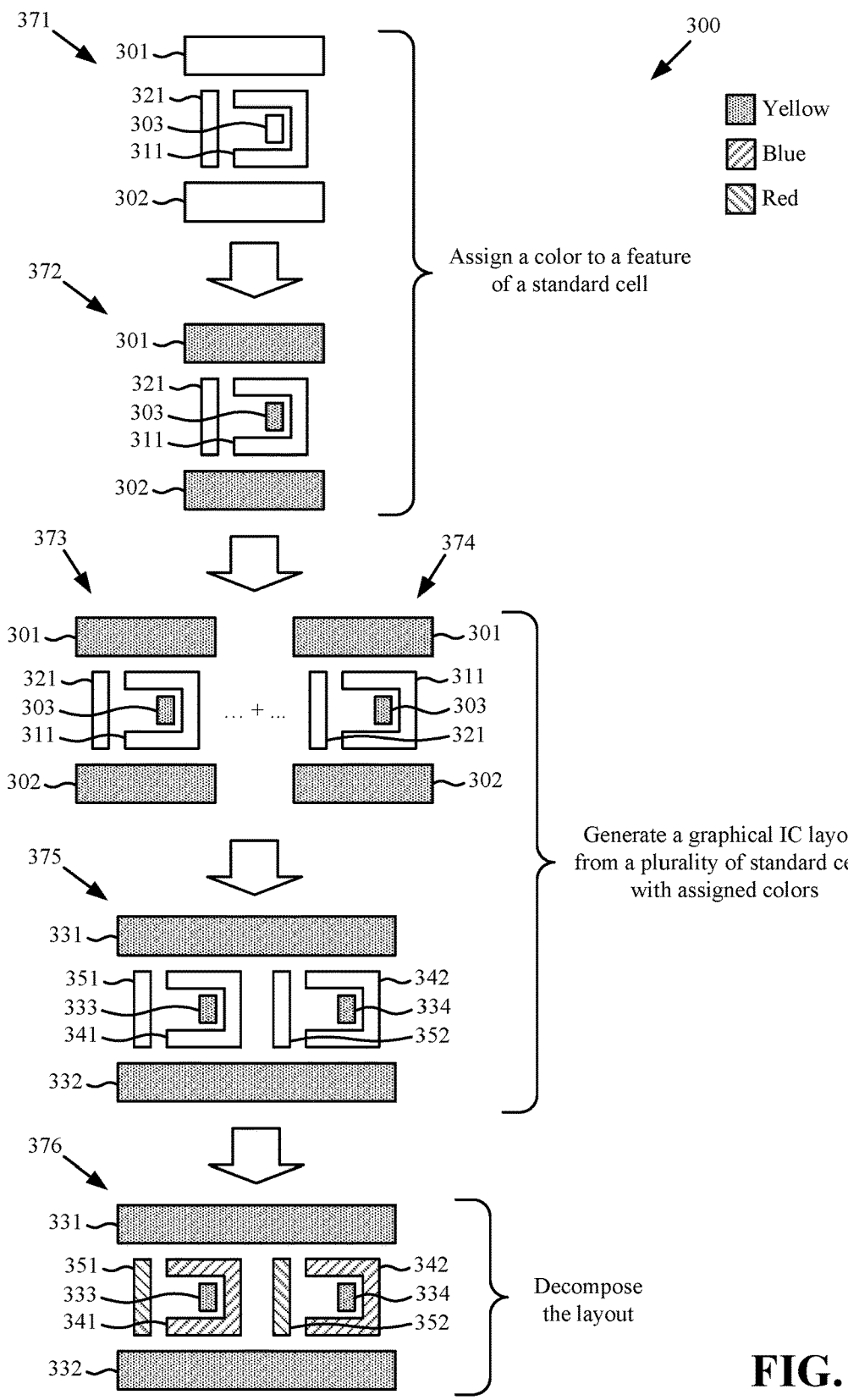
FIG. 3 is a flow diagram conceptually illustrating an example of a method of hybrid coloring during a multi-patterning lithography process.

FIG. 3 is a flow diagram 300 conceptually illustrating an example of a method of hybrid coloring during a multi-patterning lithography process. As shown in FIG. 3, the process may begin with a colorless standard cell 371, which may include features 301, 302, 303, 311, 321. The colorless standard cell 371 may have some features assigned a color (e.g., based on user input) by the color component 220. For example, the color component 220 may assign a first color (e.g., yellow) to features 301, 302, 303, and thus, generate a partially colored cell 372, with features 301, 302, 303 having the assigned first color. The partially colored cell 372 may be stored in the colored cell library 212 of the cell database 210.

Based on user input, the layout generator 230 may then use the colored standard cells, such as the partially colored cells 373, 374 from the colored cell library 212 to form a graphical IC layout. During generation of the graphical IC layout, the layout generator 230 may merge each of the cells, thereby producing an integrated layout with no cell boundaries. For example, partially colored cells 373, 374 may be merged into IC layout 375, such that features 301 of cells 373, 374 are connected seamlessly to form feature 331, and features 302 of cells 373, 374 are connected seamlessly to form feature 332. Features 333, 341, 351 of IC layout 375 correspond to features 303, 311, 321, respectively, of cell 373; and features 334, 342, 352 of IC layout 375 correspond to features 303, 311, 321, respectively, of cell 374.

The graphical IC layout may then be decomposed by decomposer 240, which may assign colors to colorless features in the graphical IC layout. For example, the decomposer 240 may assign a second color (e.g., blue) to features 341, 342 and assign a third color (e.g., red) to features 351, 352, and thus, generate a fully colored graphical IC layout 376 with features 331, 332, 333, 334 having the pre-assigned first color, features 341, 342 having the assigned second color, and features 351, 352 having the assigned third color.

After color decomposition, the process may proceed to generating multiple masks by, for example, the mask generator 250, in a manner that writes features having the same color to the same mask.

Figure 4:
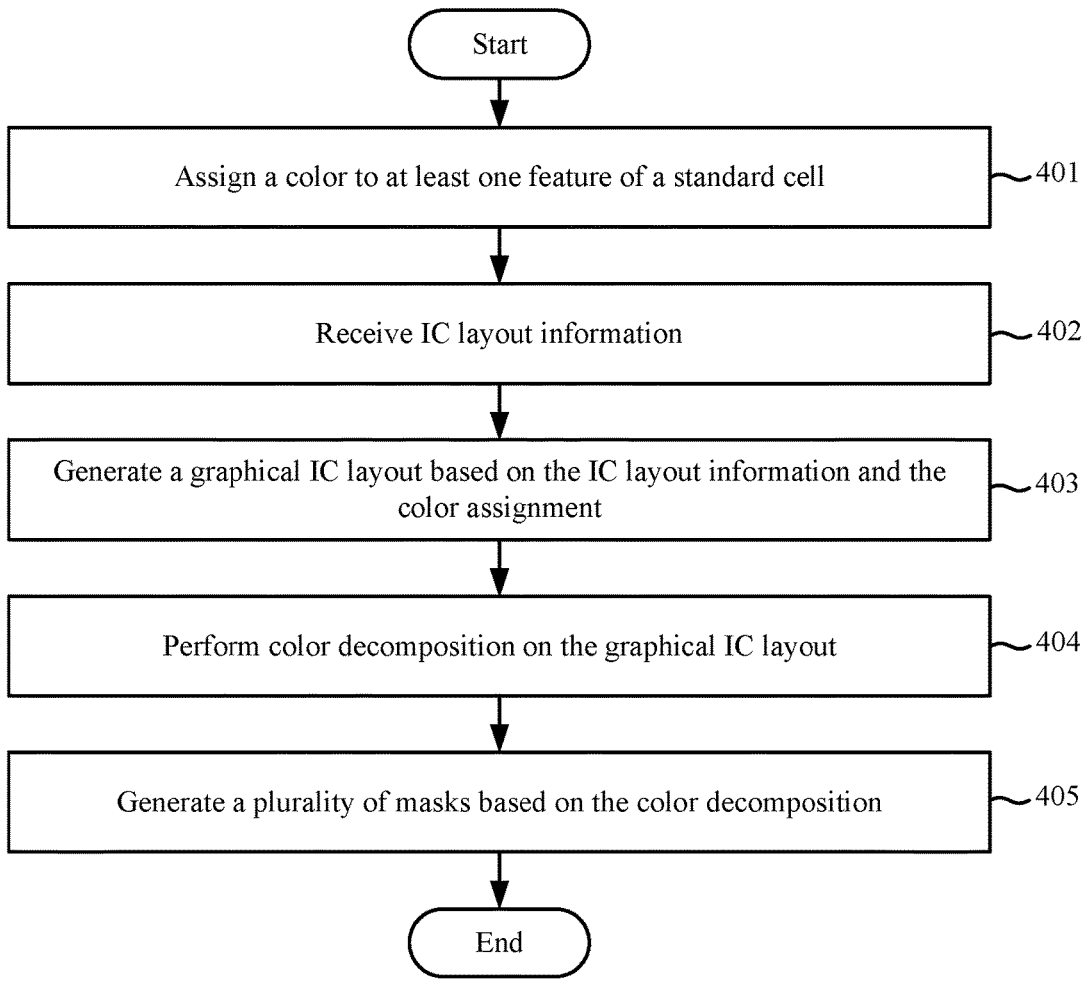
FIG. 4 is a flowchart conceptually illustrating an example of a method of hybrid coloring during a multi-patterning lithography process.

FIG. 4 is a flowchart conceptually illustrating an example of a method 400 of hybrid coloring during an MPL process. Referring to FIG. 2, in an operational aspect, the apparatus 200 may perform various aspects of the method 400. While, for purposes of simplicity of explanation, the method is shown and described as a series of acts, it is to be understood and appreciated that the method (and further methods related thereto) is/are not limited by the order of acts, as some acts may, in accordance with one or more aspects, occur in different orders and/or concurrently with other acts from that shown and described herein. For example, it is to be appreciated that a method could alternatively be represented as a series of interrelated states or events, such as in a state diagram. Moreover, not all illustrated acts may be required to implement a method in accordance with one or more features described herein. Moreover, it should be understood that the following actions or functions may be performed by a specially-programmed processor, a processor executing specially-programmed software or computer-readable media, or by any other combination of a hardware component and/or a software component capable of performing the described actions or functions.

In an aspect, at block 401, a color may be assigned to at least one feature of a standard cell. For example, referring to FIG. 2, in an aspect, the color component 220 may automatically assign, or may receive an input from a user to assign, a first color to at least one feature of a standard cell.

At block 402, IC layout information may be received. For example, referring to FIG. 2, the layout generator 230 may receive IC layout information from a user input or retrieve the IC layout information from memory.

At block 403, a graphical IC layout may be generated based on the IC layout information and the colored standard cells with a first subset of features. In an aspect, the first subset of features may include the at least one feature having the assigned color. For example, referring to FIG. 2, the layout generator 230 may use the partially colored standard cells from the colored cell library 212 for the corresponding cells in the physical layout, and generate the graphical IC layout based on the IC layout information and the partially colored standard cells.

At block 404, color decomposition may be performed on the graphical IC layout. For example, referring to FIG. 2, the decomposer 240 may receive the graphical IC layout from the layout generator 230, and execute a decomposition algorithm on the graphical IC layout to assign different colors to a second subset of uncolored features of the graphical IC layout, while maintaining the pre-assigned colors of the colored first subset of features that had already been assigned a color by the color component 220.

At block 405, a plurality of masks may be generated based on the color decomposition. For example, referring to FIG. 2, the mask generator 250 may use the graphical IC layout to generate multiple masks in a manner that writes features having the same color to the same mask.

Referring again to block 404, to perform color decomposition, an apparatus (e.g., the apparatus 200) may receive IC layout information including a set of features and an assigned color of a plurality of colors for each feature of a first subset of features of the set of features. For example, referring to FIG. 3, an apparatus may receive IC layout information including a set of features 331, 332, 333, 334, 341, 342, 351, 352 and an assigned color (e.g., yellow) of a plurality of colors (e.g., yellow, blue, red) for each feature of a first subset of features 331, 332, 333, 334 of the set of features 331, 332, 333, 334, 341, 342, 351, 352. In addition, the apparatus may perform color decomposition on a second subset of features 341, 342, 351, 352 to assign colors to features in the second subset of features 341, 342, 351, 352. The second subset of features 341, 342, 351, 352 includes features in the set of features 331, 332, 333, 334, 341, 342, 351, 352 that are not included in the first subset of features 331, 332, 333, 334 with the assigned color.

In one configuration, the multiple pattern process is an n-patterning process with n colors, the set of features includes p features, the first subset of features includes q features, the second subset of features includes p–q features, and the color decomposition is performed on the p–q features within the second subset of features and with a subset of the n colors. For example, referring to FIG. 3, the multiple pattern process is an triple-patterning process with 3 (n=3) colors, the set of features 331, 332, 333, 334, 341, 342, 351, 352 includes 8 (p=8) features, the first subset of features 331, 332, 333, 334 includes 4 (q=4) features, the second subset of features 341, 342, 351, 352 includes 4 (p–q=4) features, and the color decomposition is performed on the 4 (p–q) features within the second subset of features 341, 342, 351, 352 and with a subset of the 3 colors.

In one configuration, the color decomposition is performed on the p–q features within the second subset of features with n colors. For example, referring to FIG. 3, the color decomposition may be performed on the 4 (p–q) features within the second subset of features 341, 342, 351, 352 with all 3 colors (e.g., yellow, blue, red). Alternatively, the color decomposition may be performed on the 4 (p–q) features within the second subset of features 341, 342, 351, 352 with less than the 3 colors (e.g., blue, red). In one configuration, the first subset of features has m different colors, and the color decomposition is performed on the p–q features within the second subset of features with x colors, where n–m≤x≤n. For example, referring to FIG. 3, the first subset of features 331, 332, 333, 334 has one different color (yellow), and the color decomposition is performed on the 4 (p–q) features within the second subset of features 341, 342, 351, 352 with x colors, where n–m≤x≤n. Specifically, as n=3 and m=1, 2≤x≤3. Accordingly, the color decomposition may be performed on the features 341, 342, 351, 352 with 2 colors or 3 colors. In one configuration, x is equal to n–m, and colors assigned to the first subset of features are not considered for assigning during color decomposition, and therefore with respect to FIG. 3, the color decomposition may be performed on the second subset of features 341, 342, 351, 352 with 2 colors (e.g., blue, red).

As discussed supra, the features may include at least one of a metal interconnect, a power rail, a POLY gate interconnect, a via, an MP interconnect, or an MD interconnect. In one configuration, the assigned color of each feature of the first subset of features is assigned by a user. In one configuration, the first subset of features include at least one power rail. For example, referring to FIG. 3, the first subset of features 331, 332, 333, 334 includes the power rails 331, 332. The power rail 331 may power (e.g., $V_{dd}$) a set of p-type metal oxide transistor (pMOS) transistors, and the power rail 332 may power (e.g., $V_{ss}$) a set of n-type metal oxide transistor (nMOS) transistors.

Figure 5:
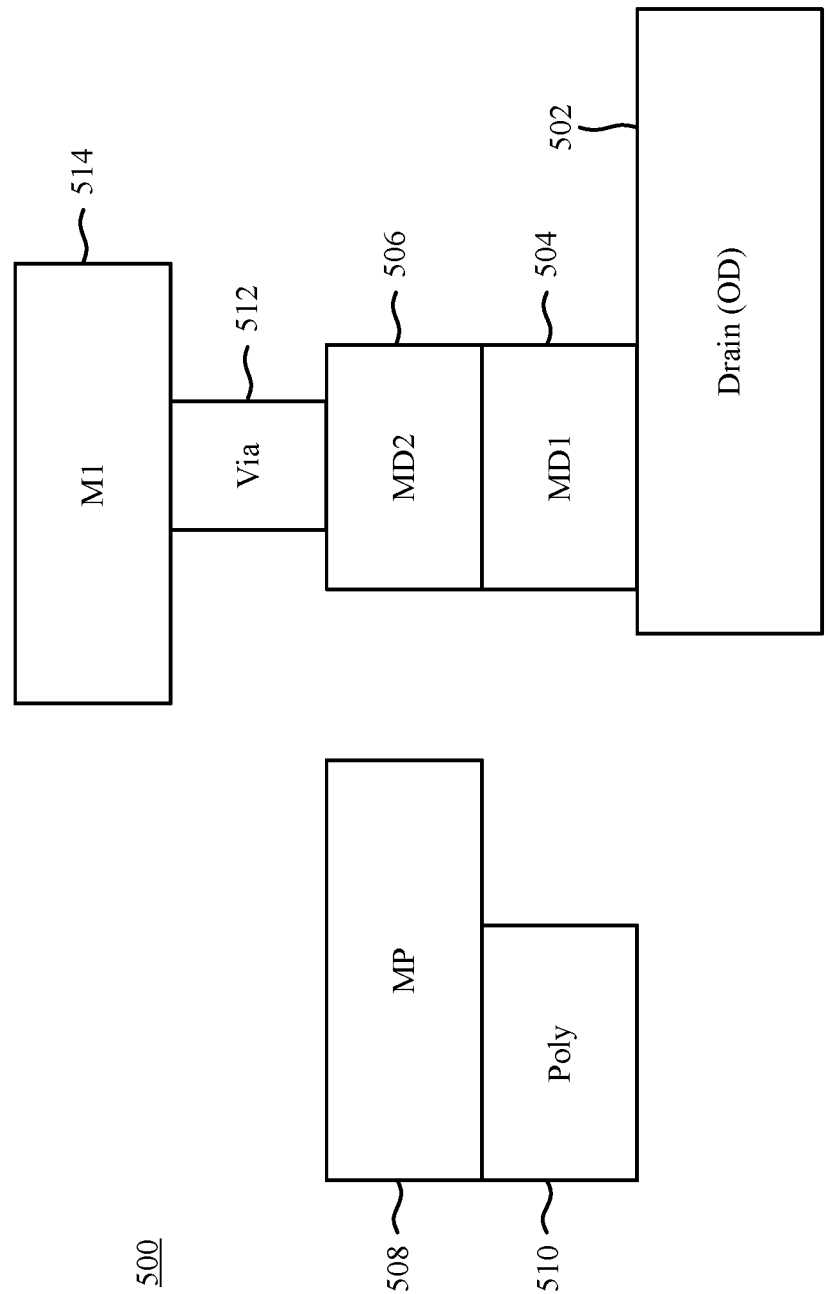
FIG. 5 is a diagram conceptually illustrating a side profile of various features that may be formed in a multi-patterning lithography process.

FIG. 5 is a diagram 500 conceptually illustrating a side profile of various features that may be formed in an MPL process. The POLY interconnect 510 may be a metal interconnect, such as in a 20 nm process technology. However, in other process technologies, the POLY interconnect 510 may be entirely polysilicon or may be polysilicon with a metal top layer. An MP layer interconnect 508 may contact the POLY interconnect 510. A first MD (MD1) layer interconnect 504 may be on the drain 502 (also referred to as oxide diffusion (OD)), and a second MD (MD2) layer interconnect 506 may be on the first MD1 layer interconnect 504. The first and second MD layers 504, 506 may be referred to herein as just one MD layer. The MD layer may connect directly to the drain 502. The POLY interconnect 510 and the MD1 layer interconnect 504 are on the same layer. The MP layer interconnect 508 and the MD2 layer interconnect 506 are on the same layer. A via 512 may contact the MD2 layer interconnect 506. A metal one (M1) layer interconnect 514 may contact the via 512.

Figure 6:
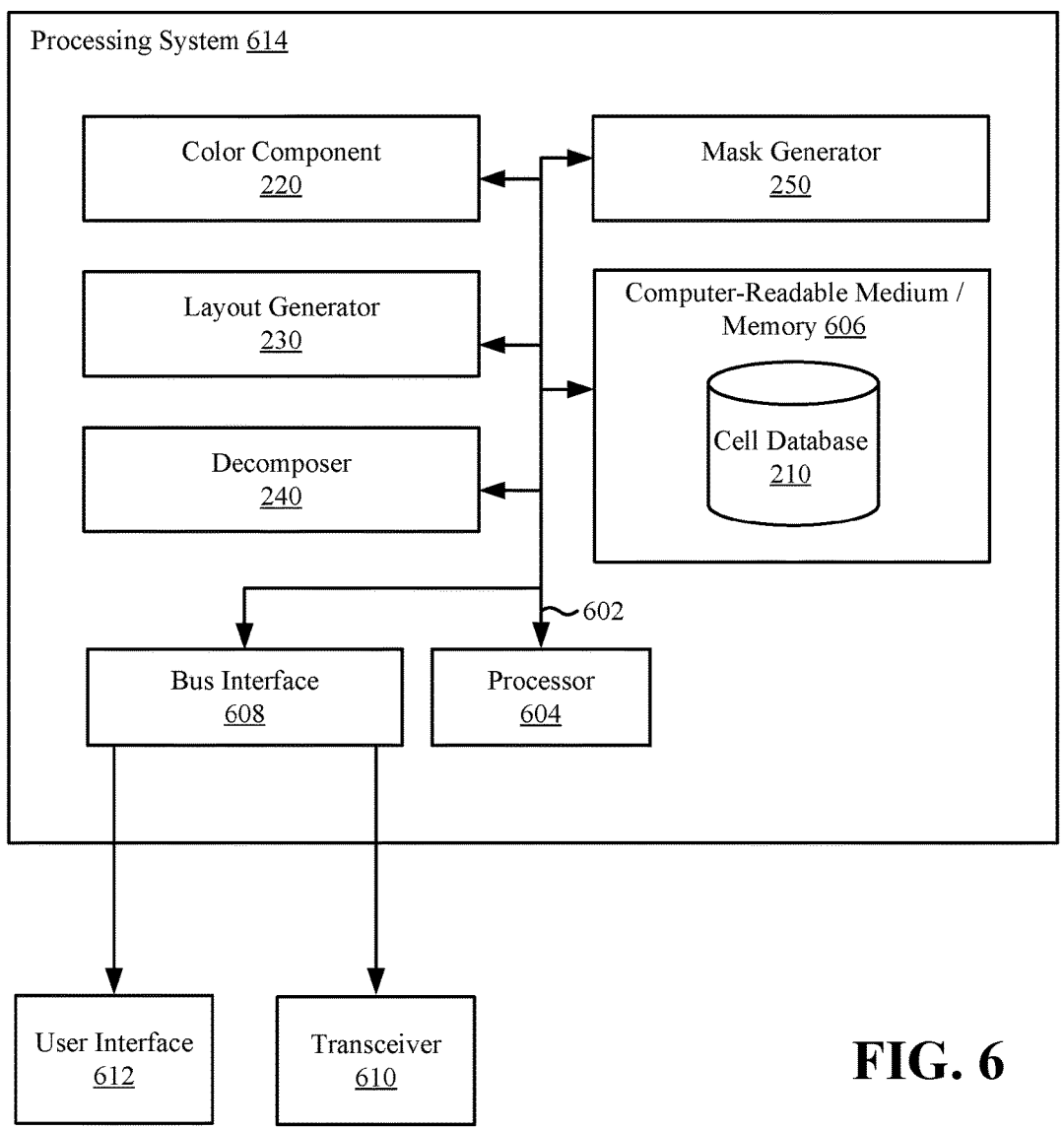
FIG. 6 is a diagram conceptually illustrating an example of a hardware implementation for an apparatus employing a processing system configured for hybrid coloring during a multi-patterning lithography process.

FIG. 6 is a conceptual diagram illustrating an example of a hardware implementation for an apparatus 600 employing a processing system 614 for hybrid coloring during an MPL process. The apparatus 600 may correspond to the apparatus 200 of FIG. 2. In this example, the processing system 614 may be implemented with a bus architecture, represented generally by the bus 602. The bus 602 may include any number of interconnecting buses and bridges depending on the specific application of the processing system 614 and the overall design constraints. The bus 602 may link together various circuits including one or more processors, represented generally by the processor 604, and computer-readable media, represented generally by the computer-readable medium/memory 606. The bus 602 may also link color component 220, layout generator 230, decomposer 240, and mask generator 250 to processor 604, and computer-readable medium/memory 606, which may include the cell database 210. The bus 602 may also link various other circuits such as timing sources, peripherals, voltage regulators, and power management circuits, which are well known in the art, and therefore, will not be described any further. A bus interface 608 may provide an interface between the bus 602 and a transceiver 610. The transceiver 610 may provide a means for communicating with various other apparatus over a transmission medium. A user interface 612 (e.g., keypad, display, speaker, microphone, joystick) may also be provided.

The processor 604 is responsible for managing the bus 602 and general processing, including the execution of software stored on the computer-readable medium 606. The software, when executed by the processor 604, causes the processing system 614 to perform the various functions described infra for any particular apparatus. The computer-readable medium 606 may also be used for storing data that is manipulated by the processor 604 when executing software.

In an aspect, the color component 220, layout generator 230, decomposer 240, and mask generator 250 may be implemented by software or computer-executable codes stored in computer-readable medium and executed on processor 604, and/or by processor modules within processor 604.

In one configuration, the apparatus (e.g., one or more of the components of the processing system 614) for assigning feature colors for a multiple patterning process includes means for receiving IC layout information including a set of features and an assigned color of a plurality of colors for each feature of a first subset of features of the set of features. In addition, the apparatus includes means for performing color decomposition on a second subset of features to assign colors to features in the second subset of features. The second subset of features includes features in the set of features that are not included in the first subset of features with the assigned color. In an aspect, the multiple pattern process is an n-patterning process with n colors. In a further aspect, the set of features includes p features. In another aspect, the first subset of features includes q features. In yet another aspect, the second subset of features includes p–q features. In still a further aspect, the means for performing color decomposition is configured to perform color decomposition on the p–q features within the second subset of features and with a subset of the n colors. In another aspect, the means for performing color decomposition is configured to perform color decomposition on the p–q features within the second subset of features with n colors. In one aspect, the first subset of features has m different colors. In another aspect, the means for performing color decomposition is configured to perform color decomposition on the p–q features within the second subset of features with x colors. In one aspect, $n-m \leq x \leq n$. In a further aspect, x is equal to n–m. In yet another aspect, the features may include at least one of a metal interconnect, a metal cut, a power rail, a POLY gate interconnect, a POLY cut, a via, an MP interconnect, a metal POLY cut, a MD interconnect, a CA interconnect, or a CB interconnect. In one aspect, the assigned color of each feature of the first subset of features is assigned by a user. In still another aspect, the first subset of features may include at least one power rail.

As described supra, an apparatus for assigning feature colors for a multiple patterning process is provided. Generally, if features remain colorless before performing color decomposition, an apparatus must consider $n^p$ different color combinations for an IC layout, where n is the number of colors and p is the number of features in the IC layout. The apparatus may pre-assign (e.g., based on user input) colors to q of the features. With the pre-assignment of colors to features, the apparatus may consider $n^{p-q}$ different color combinations if the color decomposition is performed with each of the colors. If m colors are pre-assigned, and the color decomposition is performed with colors other than the m colors, then the apparatus may consider $(n-m)^{p-q}$ different color combinations. Reducing the number of color combinations when performing the color decomposition is beneficial, as the total processing time for assigning colors to features in an IC layout may be decreased.

Several processors have been described in connection with various apparatuses and methods. These processors may be implemented using electronic hardware, computer software, or any combination thereof. Whether such processors are implemented as hardware or software will depend upon the particular application and overall design constraints imposed on the system. By way of example, a processor, any portion of a processor, or any combination of processors presented in this disclosure may be implemented with a microprocessor, microcontroller, digital signal processor (DSP), a field programmable gate array (FPGA), a programmable logic device (PLD), a state machine, gated logic, discrete hardware circuits, and other suitable processing component configured to perform the various functions described throughout this disclosure. The functionality of a processor, any portion of a processor, or any combination of processors presented in this disclosure may be implemented with software being executed by a microprocessor, microcontroller, DSP, or other suitable platform. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. A computer-readable medium may include, by way of example, memory such as a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, or a removable disk. Although memory is shown separate from the processors in the various embodiments presented throughout this disclosure, the memory may be internal to the processors (e.g., cache or register). A computer-readable medium may also include a carrier wave, a transmission line, or any other suitable medium for storing or transmitting software. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method of assigning feature colors via a processing device for a multiple patterning process, comprising:
   receiving, via the processing device, first integrated circuit layout information comprising a set of features;
   determining, via the processing device, whether a first subset of features of set of features of the first integrated circuit layout information is maintained in a colored cell library;
   generating, via the processing device, second integrated circuit layout information that includes the first subset of features of the set of features with an assigned color and a second subset of features of the set of features that are colorless when the first subset of features corresponds to at least one preconfigured colored cell of a group of preconfigured colored cells and when the second subset of features do not correspond to any of the group of preconfigured colored cells upon determining that the first subset of features of the set of features is maintained in the colored cell library and associated with the assigned color;
   performing, via the processing device, color decomposition on the second subset of features to assign different colors to features in the second subset of features, the second subset of features including features in the set of features that are not included in the first subset of features with the assigned color; and
   generating, via the processing device, a mask for use in fabricating a semiconductor device, wherein the mask is generated based at least in part on the different colors assigned to features in the second subset of features.

2. The method of claim 1, wherein the multiple pattern process is an n-patterning process with n colors, the set of features comprises p features, the first subset of features comprises q features, the second subset of features includes p−q features, and wherein the color decomposition is performed on the p−q features within the second subset of features and with a subset of the n colors.

3. The method of claim 2, wherein the color decomposition is performed on the p−q features within the second subset of features with n colors.

4. The method of claim 2, wherein the first subset of features has m different colors, and the color decomposition is performed on the p−q features within the second subset of features with x colors, where n−m≤x≤n.

5. The method of claim 4, wherein x is equal to n−m.

6. The method of claim 1, wherein the features comprise at least one of a metal interconnect, a metal cut, a power rail, a POLY gate interconnect, a POLY cut, a via, a metal POLY (MP) interconnect, a metal POLY cut, a metal diffusion (MD) interconnect, a metal diffusion contact A (CA) interconnect, or a metal diffusion contact B (CB) interconnect.

7. The method of claim 1, wherein the assigned color of each feature of the first subset of features is assigned by a user.

8. The method of claim 1, wherein the first subset of features comprise at least one power rail.

9. An apparatus for assigning feature colors for a multiple patterning process, comprising:
   means for receiving first integrated circuit layout information comprising a set of features;
   means for determining whether a first subset of features of set of features of the first integrated circuit layout information is maintained in a colored cell library;
   means for generating second integrated circuit layout information that includes the first subset of features of the set of features with an assigned color and a second subset of features of the set of features that are colorless when the first subset of features corresponds to at least one preconfigured colored cell of a group of preconfigured colored cells and when the second subset of features do not correspond to any of the group of preconfigured colored cells upon determining that the first subset of features of the set of features is maintained in the colored cell library and associated with the assigned color;
   means for performing color decomposition on the second subset of features to assign different colors to features in the second subset of features, the second subset of features including features in the set of features that are not included in the first subset of features with the assigned color; and
   means for generating a mask for use in fabricating a semiconductor device, wherein the mask is generated based at least in part on the different colors assigned to features in the second subset of features.

10. The apparatus of claim 9, wherein the multiple pattern process is an n-patterning process with n colors, the set of features comprises p features, the first subset of features comprises q features, the second subset of features includes p−q features, and wherein the means for performing color decomposition is configured to perform color decomposition on the p−q features within the second subset of features and with a subset of the n colors.

11. The apparatus of claim 10, wherein the means for performing color decomposition is configured to perform color decomposition on the p−q features within the second subset of features with n colors.

12. The apparatus of claim 10, wherein the first subset of features has m different colors, and the means for performing color decomposition is configured to perform color decomposition on the p−q features within the second subset of features with x colors, where n−m≤x≤n.

13. The apparatus of claim 12, wherein x is equal to n−m.

14. The apparatus of claim 9, wherein the features comprise at least one of a metal interconnect, a metal cut, a power rail, a POLY gate interconnect, a POLY cut, a via, a metal POLY (MP) interconnect, a metal POLY cut, a metal diffusion (MD) interconnect, a metal diffusion contact A (CA) interconnect, or a metal diffusion contact B (CB) interconnect.

15. The apparatus of claim 9, wherein the assigned color of each feature of the first subset of features is assigned by a user.

16. The apparatus of claim 9, wherein the first subset of features comprise at least one power rail.

17. An apparatus for assigning feature colors for a multiple patterning process, comprising:
a memory; and
at least one processor coupled to the memory and configured to:
receive first integrated circuit layout information comprising a set of features;
determine whether a first subset of features of set of features of the first integrated circuit layout information is maintained in a colored cell library;
generate second integrated circuit layout information that includes the first subset of features of the set of features with an assigned color and a second subset of features of the set of features that are colorless when the first subset of features corresponds to at least one preconfigured colored cell of a group of preconfigured colored cells and when the second subset of features do not correspond to any of the group of preconfigured colored cells upon determining that the first subset of features of the set of features is maintained in the colored cell library and associated with the assigned color;
perform color decomposition on the second subset of features to assign different colors to features in the second subset of features, the second subset of features including features in the set of features that are not included in the first subset of features with the assigned color; and
generating a mask for use in fabricating a semiconductor device, wherein the mask is generated based at least in part on the different colors assigned to features in the second subset of features.

18. The apparatus of claim 17, wherein the multiple pattern process is an n-patterning process with n colors, the set of features comprises p features, the first subset of features comprises q features, the second subset of features includes p−q features, and wherein the at least one processor is configured to perform color decomposition on the p−q features within the second subset of features and with a subset of the n colors.

19. The apparatus of claim 18, wherein the at least one processor is configured to perform color decomposition on the p−q features within the second subset of features with n colors.

20. The apparatus of claim 18, wherein the first subset of features has m different colors, and the at least one processor is configured to perform color decomposition on the p−q features within the second subset of features with x colors, where n−m≤x≤n.

21. The apparatus of claim 20, wherein x is equal to n−m.

22. The apparatus of claim 17, wherein the features comprise at least one of a metal interconnect, a metal cut, a power rail, a POLY gate interconnect, a POLY cut, a via, a metal POLY (MP) interconnect, a metal POLY cut, a metal diffusion (MD) interconnect, a metal diffusion contact A (CA) interconnect, or a metal diffusion contact B (CB) interconnect.

23. The apparatus of claim 17, wherein the assigned color of each feature of the first subset of features is assigned by a user.

24. The apparatus of claim 17, wherein the first subset of features comprise at least one power rail.

25. A non-transitory computer-readable medium for assigning feature colors for a multiple patterning process, via a processing device, comprising code executable by a computer to:
receive, via the processing device, first integrated circuit layout information comprising a set of features;
determine, via the processing device, whether a first subset of features of set of features of the first integrated circuit layout information is maintained in a colored cell library;
generate, via the processing device, second integrated circuit layout information that includes the first subset of features of the set of features with an assigned color and a second subset of features of the set of features that are colorless when the first subset of features corresponds to at least one preconfigured colored cell of a group of preconfigured colored cells and when the second subset of features do not correspond to any of the group of preconfigured colored cells upon determining that the first subset of features of the set of features is maintained in the colored cell library and associated with the assigned color;
perform color decomposition on the second subset of features to assign different colors to features in the second subset of features via the processing device, the second subset of features including features in the set of features that are not included in the first subset of features with the assigned color; and
generating, via the processing device, a mask for use in fabricating a semiconductor device, wherein the mask is generated based at least in part on the different colors assigned to features in the second subset of features.

* * * * *